United States Patent [19]

Mori et al.

[11] Patent Number: 4,928,016

[45] Date of Patent: May 22, 1990

[54] MAGAZINE FOR ACCOMMODATING RECORDING MEDIUM FOR ELECTRON MICROSCOPE

[75] Inventors: Nobufumi Mori; Katsuaki Muraishi; Terumi Matsuda; Masahiro Ohnishi, all of Kaisei; Hiromi Nunome, Akishima; Tadao Koyama, Akishima; Tetsuo Oikawa, Akishima, all of Japan

[73] Assignee: Fuji Photo Film Co. Ltd., Kanagawa, Japan

[21] Appl. No.: 281,414

[22] Filed: Dec. 8, 1988

[30] Foreign Application Priority Data

Dec. 16, 1987 [JP] Japan .................................. 62-317732

[51] Int. Cl.$^5$ ...................... H01J 37/26; G06K 13/00; G03G 13/00
[52] U.S. Cl. .................................. 250/440.1; 250/311; 250/442.1
[58] Field of Search ................... 250/311, 440.1, 442.1, 250/491.1

[56] References Cited

U.S. PATENT DOCUMENTS

| | | | |
|---|---|---|---|
| 3,671,742 | 6/1972 | Browning | 250/311 |
| 4,013,262 | 3/1987 | Schott et al. | 250/442.1 |
| 4,467,210 | 8/1984 | Sugihara et al. | 250/442.1 |
| 4,651,220 | 3/1987 | Hosoi et al. | 250/311 |
| 4,742,216 | 5/1988 | Morse et al. | 250/311 |
| 4,810,886 | 3/1989 | Mori et al. | 250/311 |

Primary Examiner—Bruce C. Anderson
Attorney, Agent, or Firm—Sughrue, Mion, Zinn, Macpeak & Seas

[57] ABSTRACT

A rack for housing recording media for an electron microscope includes a vertically movable rack for accommodating the recording media and composed of a plurality of shelves, and a unit for pushing out the recording media as well as a unit for entrance and exit of the recording media are provided at a predetermined height position. Two-dimensional sensors or cassettes for photographic films are accommodated within the rack. For photography, the rack is moved up and down to extract the desired two-dimensional sensors or cassettes for photographic films by the recording media pushing unit and the exit unit. After photography, the recording media are returned by the recording media entrance unit to the original position in the rack, so that a single magazine suffices for the receiving magazine and the feed magazine.

10 Claims, 2 Drawing Sheets

MAGAZINE FOR ACCOMMODATING RECORDING MEDIUM FOR ELECTRON MICROSCOPE

BACKGROUND OF THE INVENTION

This invention relates to improvements in a magazine for housing or accommodating a recording medium, such as a film, for an electron microscope.

In the prior art, a feed magazine housing a film on which an image has not been formed and a receiving magazine adapted to house a film on which an image has been formed are provided on the same plane within a camera compartment. The film on which the image has not been formed is taken out at an opening in an upper cover of the feed magazine so as to then be transported to an imaging or shooting position, where the image is formed on the film by shooting. The film thus carrying the image is then re-introduced via the opening in the upper cover of the receiving magazine.

FIGS. 5 and 6 illustrate the camera compartment of the above-described conventional electron microscope. In FIGS. 5 and 6, numeral 1 denotes a feed magazine, 2 a receiving magazine, 3 a film on which an image has not been formed, 4 a film on which an image has been formed, 5 a spring, 6 a table, 7 table supporting members, 8 a pawl, 9 a carriage, 10 rails, and 11 an electric motor. The numerals 12, 13, 14, 15 and 16 denote gears, and the numeral 17 denotes a link member.

In the drawing, the feed magazine 1 housing the film on which the image has not been formed and the receiving magazine 2 housing the film on which the image has been formed, are placed in the same horizontal plane in the camera compartment where a vacuum is established during shooting. The film 3 on which the image has not been formed tends to bend and therefore is accommodated within a metal cassette to prevent this. The film 3 is biased upward at all times within the feed magazine 1 by the spring 5. The table 6 is placed at the shooting position and moved up and down by oscillating the table supporting members 7. The gears 12, 13, 14 and 15 are rotated by rotation of the motor 11 and the gear 16 revolves as a planetary gear. As a result, carriage 9 is moved linearly on the rails 10 by the link member 17. The carriage 9 is provided with a pawl 8 for engaging the cassette accommodating the film.

To perform photography, the motor 11 is driven to rotate the gears 13 to 16, whereby the link is moved linearly such that the film 3 on which the image has not been formed is extracted by the pawl 8 of the carriage and placed on the table 6. After photography, the table supporting members 7 are rotated counter-clockwise from the position shown to uplift the table 6. As the carriage 6 is moved rightward in this state, the image 3 on which the film has been formed is transported towards and received within the receiving magazine 2.

The above-described sequence of operations is repeated to sequentially accommodate the film 3 on which the image has been formed within the receiving magazine 2.

As described above, the feed magazine and the receiving magazine are provided separately within the camera compartment of the conventional electron microscope and the cassette accommodating the film is taken out at the opening in the magazine upper cover and re-introduced at the other opening in the cover. The result is that the feed magazine and the receiving magazine are responsible only for feeding and receiving the film, respectively. In addition, the cassette has to be lifted at all times within the feed magazine. Consequently, not only is operability poor but the magazine and the overall camera compartment of the electron microscope are increased in size.

There has recently been proposed a new electron microscope system in which a two-dimensional sensor such as a stimulable phosphor sheet for storing electron beam energy is exposed to an electron beam passing through a specimen in a vacuum to have the electron beam energy stored in the two-dimensional sensor, the two-dimensional sensor is then exposed to light or heat to release the stored energy as light emission, the emitted light is photoelectrically detected to obtain an image signal, and the image of the electron beam which has passed through the specimen is reproduced by using the image signal (see Japanese Patent Application Laid-Open Nos. 61-51738 and 61-93539). In this manner, image recording and reproduction can be realized with high sensitivity and high picture quality. To realize selective recording with the use of both the photographic film and the two-dimensional sensor, it is necessary to provide not only a feed magazine, a receiving magazine and transport means for the photographic film, but also a feed magazine, a receiving magazine and transport means for the two-dimensional sensor, as disclosed in Japanese Application Laid-Open No. 61-234125. The result is a camera compartment that is large in size.

SUMMARY OF THE INVENTION

It is a principal object of the present invention to solve the foregoing problems and to provide a magazine for housing or accommodating recording media for an electron microscope, according to which a single magazine may be used simultaneously as the receiving magazine and the feed magazine to reduce the size of the camera compartment and may be adapted for both two-dimensional sensors and photographic films.

According to the present invention, there is provided a magazine for accommodating recording media for an electron microscope comprising a vertically movable rack for the recording media composed of a plurality of shelves, means provided at a predetermined height position for pushing out the recording media at this position, and means for accommodating the recording media within the rack.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENT

Figure 1:
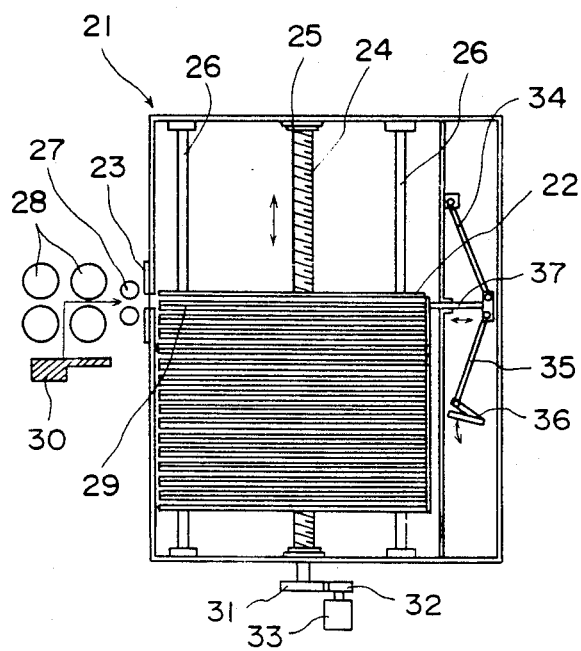
FIG. 1 is a front view showing an embodiment of the present invention.
Figure 2:
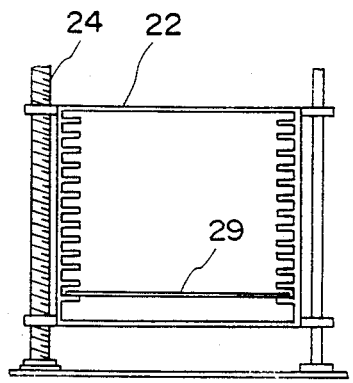
FIG. 2 is a side elevational view thereof.
Figure 3:
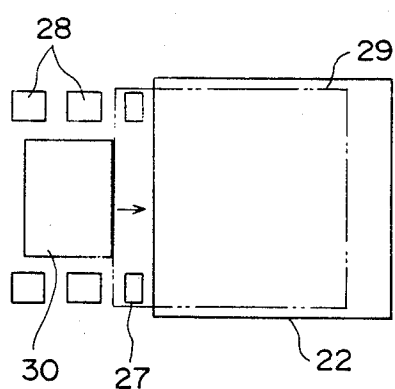
FIG. 3 is a plan view for describing how the recording medium is accommodated.

FIG. 1 is a front view showing an embodiment of the present invention, FIG. 2 is a side elevational view thereof, and FIG. 3 is a plan view for describing how the recording medium is to be accommodated.

In the drawing, numeral 21 denotes a magazine, 22 a rack for holding the recording media, 23 a light-shielding plate, 24 a screw shaft, 25 bearings, 26 guide rods, 27 exit and entrance rollers, 28 feed rollers, 29 recording media and 30 an entrance plate. Numerals 31 and 32 denote gears and numeral 33 an electric motor. Numerals 34 and 35 denote link members. Numeral 36 denotes a pawl and 37 a thrusting plate.

Provided within the magazine 21 is a rack 22 for holding the recording media 29 composed of a plurality of shelves for separately holding the recording media such as two-dimensional sensors or cassettes for photographic films. The rack 22 for holding the recording media is mounted on the screw shaft 24 secured to the magazine 21 by bearings 25 and is movable vertically along the guide shaft 26 as the screw shaft 24 is turned about its own axis through the intermediary of the gears 31, 32.

The thrusting plate 37, which is adapted to thrust the recording media 29 out of the rack 22, is provided on the side opposite the shooting side, and is actuated by a link mechanism composed of the link members 34 and 35 and the pawl 36. For photography, the rack 22 is moved up and down and brought to a stop when the desired one of the recording media 29, such as the two-dimensional sensors or the photographic films, is at the height level of the thrusting plate 37. The pawl 36 is turned at this time to cause reciprocating movement of the thrusting plate 37, thereby urging the recording medium 29 out of the magazine 21. As the recording medium 29 is forced out several centimeters, it is pulled out by the exit and entrance rollers 27 and brought to the shooting position by the feed rollers 28.

The recording medium 29, on which the image has been formed, is fed towards the magazine 21 by the feed rollers 28 on the same horizontal plane on which it was fed to the shooting position. The recording medium 29 is then re-introduced into the rack 22 by the exit and entrance rollers 27. The recording medium 29 is further thrusted by the entrance plate 30 and drive means, not shown, both upwardly and towards the magazine, as shown by the arrow in FIG. 3, so that the recording medium 29 will be accommodated positively at the original accommodating position in the rack 22.

The light-shielding plate 23 is used to close the opening so that the light will not be admitted into the magazine 21 except when the recording medium 29 enters or exits the magazine 21.

In the above embodiment, the rack 22 is moved up and down by the rotation of the threaded shaft 24. However, the threaded shaft may naturally be substituted by a rack and pinion in a well-known manner.

Figure 4:
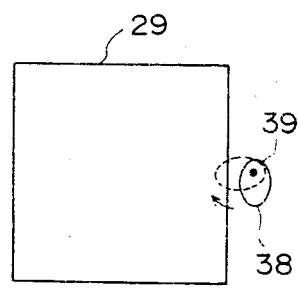
FIG. 4 shows a modification of the present invention.
Figure 5:
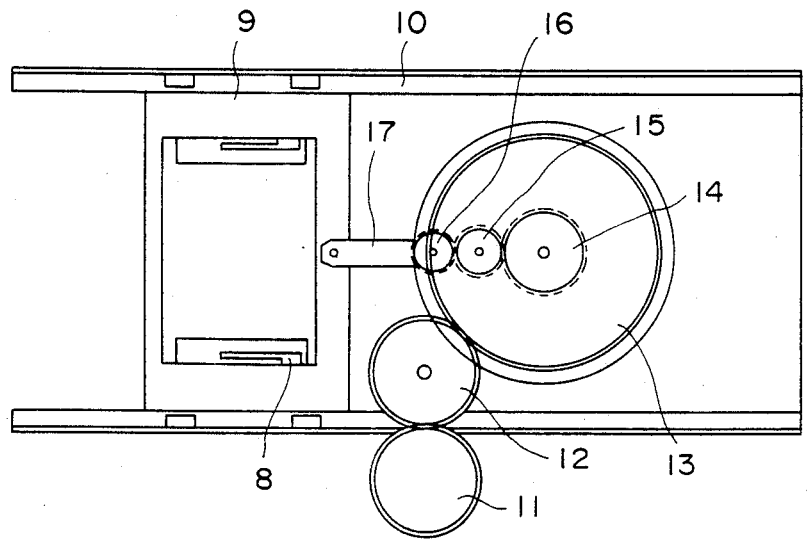
FIG. 5 is a plan view showing a camera compartment of a conventional electron microscope.
Figure 6:
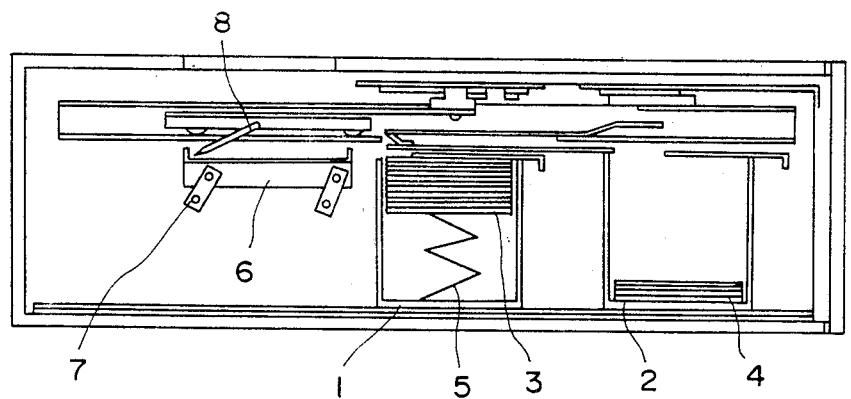
FIG. 6 is a side elevational view of FIG. 5.

A modification of the thrusting means for the recording medium is shown in FIG. 4, wherein numeral 38 denotes a cam and numeral 39 a shaft. In the present modification, the cam 38 is turned to push out the cassette 29 when the desired recording medium 29 is at the height level of the thrusting plate 37, in the manner described above.

From the foregoing it is seen that the present invention provides an arrangement in which a single magazine may play the role of both the receiving magazine and the feed magazine to reduce the space occupied by the magazine. Also, plural types of recording media, such as the two-dimensional sensors and the cassettes for photographic films, may be stored in a single magazine and a desired one of the recording media may be randomly selected and extracted, such that, depending on the type of specimen, photography may be performed using both the two-dimensional sensors and the photographic films to take advantage of both types of recording media. In addition addresses may be affixed to the locations of the rack where the recording media are accommodated and the relevant information may be stored in a computer to improve the data processing efficiency.

As many apparently widely different embodiments of the present invention can be made without departing from the spirit and scope thereof, it is to be understood that the invention is not limited to the specific embodiments thereof except as defined in the appended claims.

We claim:

1. A magazine for both supplying recording media to and receiving recording media from an electron microscope comprising:
   a vertically movable rack for said recording media composed of a plurality of shelves;
   thrusting means provided at a predetermined height position for pushing out said recording media at said position to supply said recording media to said electron microscope;
   means for reintroducing said recording media to said rack after exposure to be received in said rack; and
   accommodating means for accommodating the recording media within the rack.

2. The magazine according to claim 1, in which said recording media are two-dimensional sensors and/or photographic films.

3. The magazine according to claim 1 or 2, in which said rack is threadedly engaged with a screw shaft carried by bearings on the upper and bottom sides of the magazine, said screw shaft being driven into rotation by drive means so that said rack is vertically moved upon rotation of said screw shaft along a stationary guide in said magazine.

4. The magazine according to claim 1 or 2, in which a light-shielding plate is provided at points of entrance and exit of said recording media.

5. The magazine according to claim 1 or 2, in which entrance and exit rollers are provided outside of the entrance and exit of the recording medium.

6. The magazine according to claim 1 or 2, in which said recording media thrusting means comprises a thrusting plate which is actuated by a link mechanism to cause a reciprocating movement of said thrusting plate, thereby urging said recording media out of said magazine.

7. The magazine according to claim 1, in which said recording media thrusting means comprises a cam unit.

8. The magazine according to claim 1, in which said accommodating means is movable both parallel and orthogonal to the plane of the rack shelves.

9. The magazine according to claim 1, further comprising means for simultaneously accommodating more than one type of said recording media in different shelves of said rack.

10. The magazine according to claim 9, further comprising means for randomly selecting one of said shelves for the extraction and exposure of said recording media contained therein.

* * * * *